United States Patent
Tam et al.

(10) Patent No.: US 9,361,992 B1
(45) Date of Patent: Jun. 7, 2016

(54) LOW VOLTAGE SEMICONDUCTOR MEMORY DEVICE AND METHOD OF OPERATION

(71) Applicant: GLOBALFOUNDRIES Singapore Pte. Ltd., Singapore (SG)

(72) Inventors: Yoke Weng Tam, Singapore (SG); Zhiqi Huang, Singapore (SG); Bai Yen Nguyen, Singapore (SG); Benjamin Shui Chor Lau, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/586,494

(22) Filed: Dec. 30, 2014

(51) Int. Cl.
| | |
|---|---|
| G11C 16/06 | (2006.01) |
| G11C 16/26 | (2006.01) |
| G11C 16/30 | (2006.01) |
| G11C 16/04 | (2006.01) |
| G11C 7/06 | (2006.01) |
| G11C 16/28 | (2006.01) |
| G11C 11/56 | (2006.01) |

(52) U.S. Cl.
CPC .............. *G11C 16/26* (2013.01); *G11C 7/062* (2013.01); *G11C 16/0483* (2013.01); *G11C 16/28* (2013.01); *G11C 16/30* (2013.01); *G11C 11/5642* (2013.01)

(58) Field of Classification Search
CPC .... G11C 16/26; G11C 16/28; G11C 16/0483; G11C 7/062; G11C 11/5642
USPC .............. 365/185.21, 185.2, 185.03, 189.15
See application file for complete search history.

(56) References Cited

U.S. PATENT DOCUMENTS

| 5,386,388 A * | 1/1995 | Atwood | G11C 16/28 365/185.2 |
|---|---|---|---|
| 5,455,794 A * | 10/1995 | Javanifard | G11C 16/30 365/185.18 |
| 5,532,653 A | 7/1996 | Adkins | |
| 6,396,743 B1 * | 5/2002 | Nguyen | G11C 16/30 365/185.05 |
| 6,788,577 B2 * | 9/2004 | Mihara | G11C 8/08 365/185.18 |
| 2015/0055424 A1 * | 2/2015 | Zhou | G11C 7/08 365/189.15 |
| 2015/0078081 A1 * | 3/2015 | Zhou | G11C 7/14 365/185.03 |

FOREIGN PATENT DOCUMENTS

WO       2013148361 A1    10/2013

* cited by examiner

*Primary Examiner* — Pho M Luu
(74) *Attorney, Agent, or Firm* — Ingrassia Fisher & Lorenz, P.C.

(57) ABSTRACT

A semiconductor device for storing data includes a memory cell. The memory cell comprises a plurality of transistors. A trimmable sense amplifier is electrically connected to the memory cell. The trimmable sense amplifier is configured to provide variable current to said memory cell. A charge pump is also electrically connected to the memory cell. The charge pump includes a plurality of diodes disposed in series with one another. The charge pump includes an input for receiving an input voltage and an output for providing an output voltage greater than the input voltage to the memory cell.

20 Claims, 3 Drawing Sheets

LOW VOLTAGE SEMICONDUCTOR MEMORY DEVICE AND METHOD OF OPERATION

TECHNICAL FIELD

The present invention generally relates to semiconductor devices, and more particularly relates to low voltage memory devices.

BACKGROUND

In order to reduce power consumption and develop smaller devices, it is desirous to produce low voltage memory devices, e.g., electrically erasable programmable read-only memory ("EEPROM") devices. While such memory devices can perform read operations at the low voltage, e.g., 1.5 V, higher voltages are necessary for other operations, such as erasing and/or writing. As such, prior art EEPROM devices typically require multiple power supplies to provide multiple voltages, which in turn increase power consumption and cost of the overall device. Furthermore, utilizing multiple power supplies requires additional masks to fabricate the semiconductor devices that operate at higher voltages.

Accordingly, it is desirable to provide a semiconductor memory device that requires only a single power supply. Furthermore, other desirable features and characteristics of the present invention will become apparent from the subsequent detailed description of the invention and the appended claims, taken in conjunction with the accompanying drawings and this background of the invention.

BRIEF SUMMARY

In one embodiment, a semiconductor device includes a memory cell. The memory cell comprises a plurality of transistors. A trimmable sense amplifier is electrically connected to the memory cell. The trimmable sense amplifier is configured to provide variable current to said memory cell.

In one embodiment, a semiconductor device includes a memory cell comprising a plurality of transistors. A charge pump is electrically connected to the memory cell. The charge pump includes a plurality of diodes disposed in series with one another. The charge pump includes an input for receiving an input voltage and an output for providing an output voltage greater than the input voltage to the memory cell.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Referring to the figures, wherein like numerals indicate like parts throughout the several views, a semiconductor device 100 is shown and described herein. In the exemplary embodiment, the semiconductor device 100 operates with a received voltage of about 1.5 volts (V). However, it should be appreciated the teachings and concepts presented herein may be applied to other devices operating at different voltages. It should also be appreciated that the term "about 1.5 V" refers to a ±10% variation in the 1.5 V.

Figure 1:
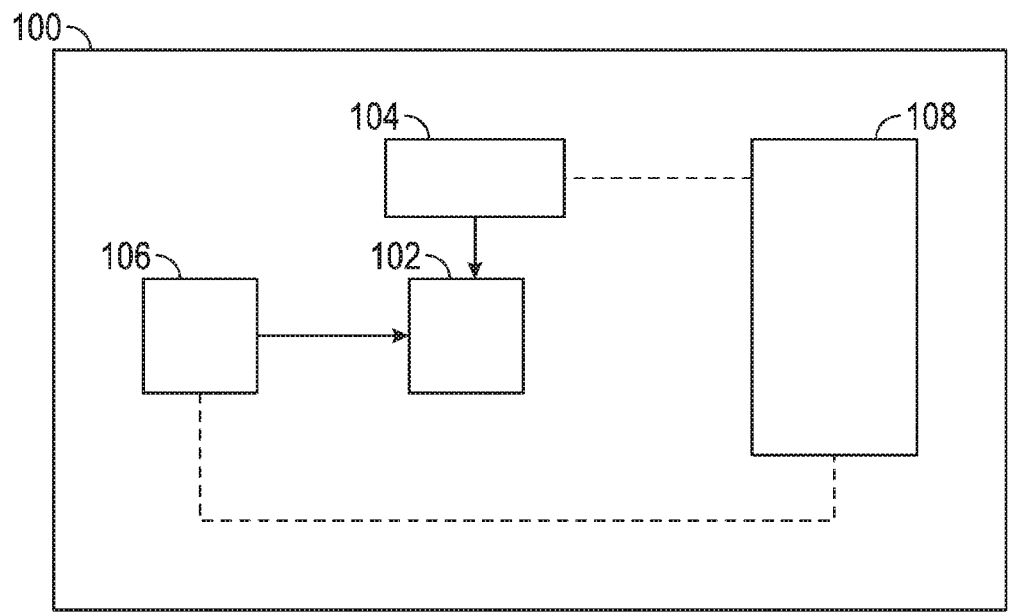
FIG. 1 is a block schematic diagram of a semiconductor device in accordance with an exemplary embodiment.

Referring specifically now to FIG. 1, the semiconductor device 100 includes at least one memory cell 102. In the exemplary embodiments, the at least one memory cell 102 is an electrically erasable programmable read-only memory ("EEPROM") cell (not separately numbered). However, it should be appreciated that other types of memory cells 102 may also or alternatively be implemented with the semiconductor device 100. The semiconductor device 100 typically includes a plurality of memory cells 102 arranged in arrays (not shown) as is appreciated by those skilled in the art. However, for purposes of simplicity in illustration, only a single memory cell 102 is shown herein.

Figure 2:
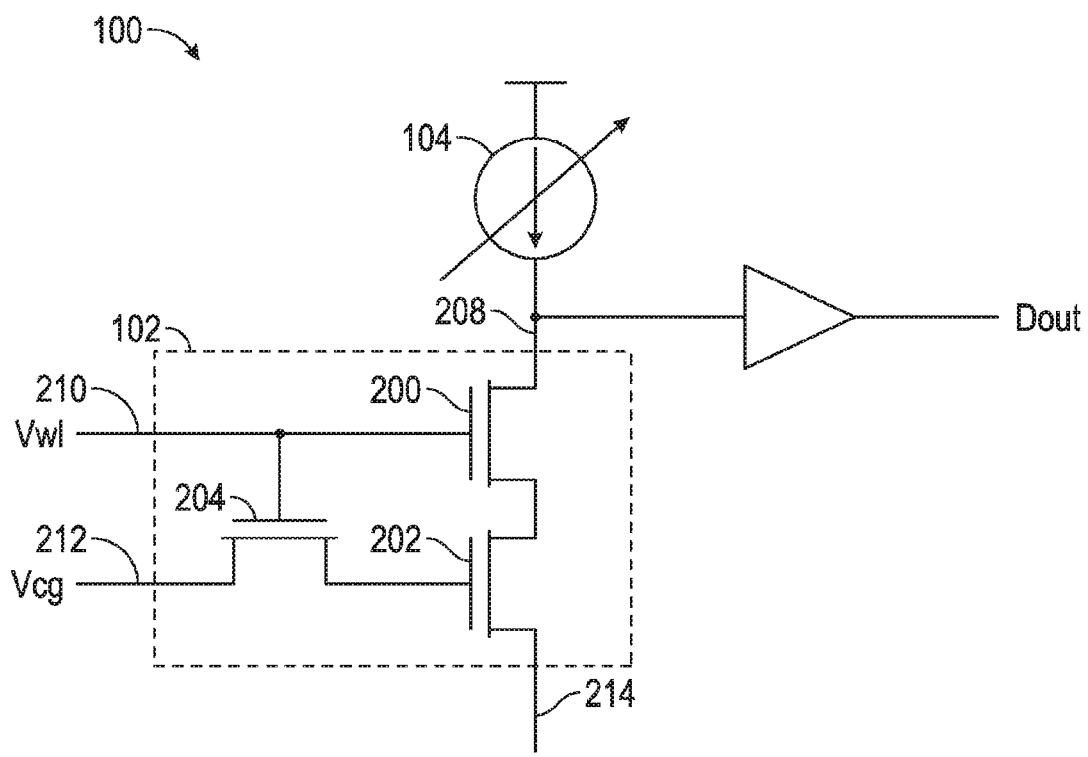
FIG. 2 is an electrical schematic diagram of a memory cell of the semiconductor device in accordance with an exemplary embodiment.

Referring now to FIG. 2, the memory cell 102 includes of a plurality of transistors 200, 202, 204 arranged to store data. In the exemplary embodiment, the transistors 200, 202, 204 are each metal-oxide-semiconductor field-effect transistors (MOSFETs). However, other type of transistors 200, 202, 204 may alternatively be implemented as appreciated by those skilled in the art.

In the exemplary embodiment, the memory cell 102 is electrically connected to a bit line 208 for sending and receiving data, a word line 210 for selecting operation of the memory cell 102, a control gate line 212 for receiving a control voltage, and a source line 214.

Referring to FIGS. 1 and 2, the semiconductor device 100 includes a trimmable sense amplifier 104 electrically connected to the memory cell 102. More specifically, in the illustrated embodiment, the trimmable sense amplifier 104 is electrically connected to the bit line 208 of the memory cell 102. The trimmable sense amplifier 104 is configured to provide variable current to the memory cell 102. As such, the trimmable sense amplifier 104 may provide a different current level to the memory cell 102 based on its configuration, as described in further detail below.

Figure 3:
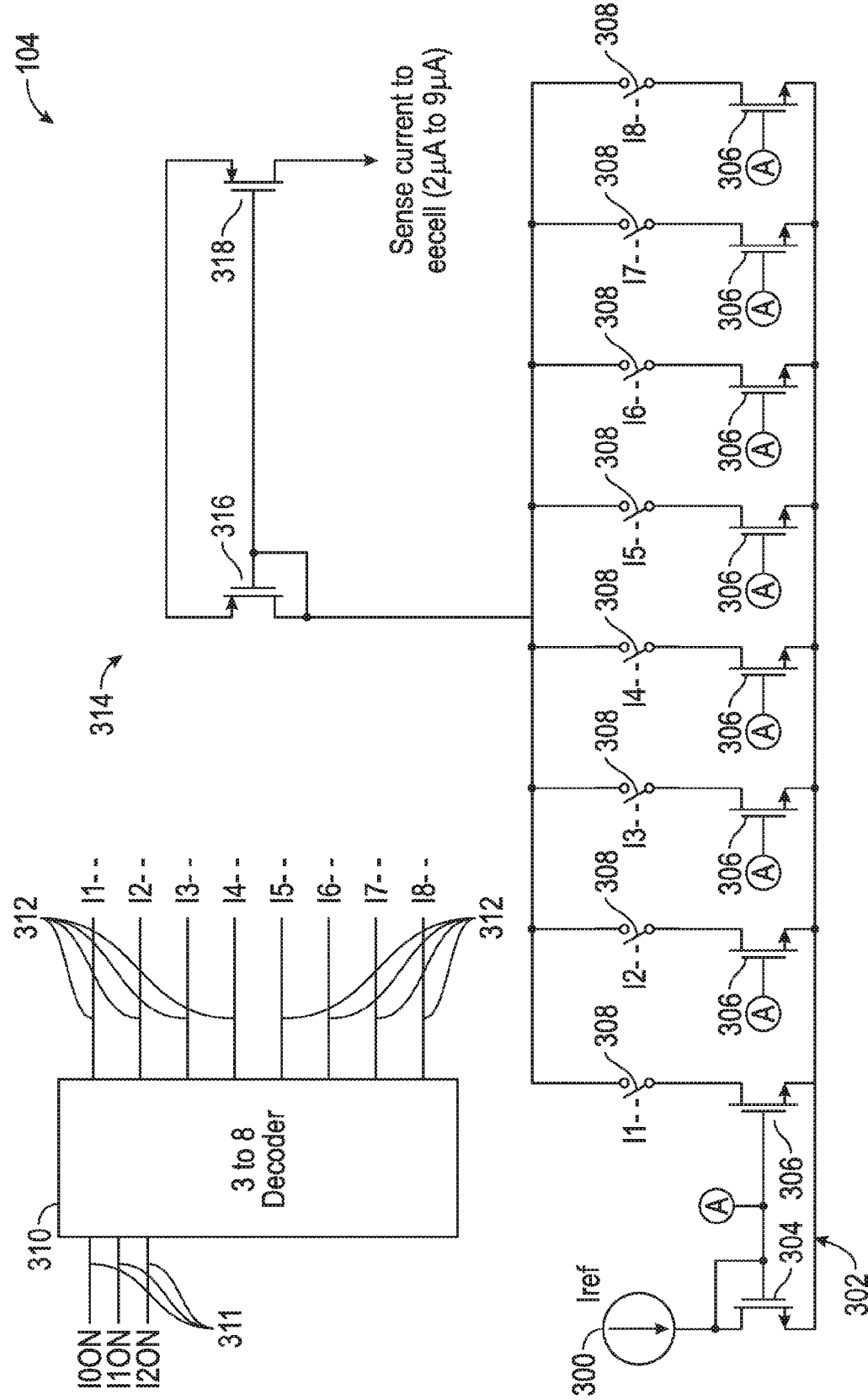
FIG. 3 is an electrical schematic of a trimmable sense amplifier of the semiconductor device in accordance with an exemplary embodiment.

Referring now to FIG. 3, the trimmable sense amplifier 104 includes a reference current source 300. In the illustrated embodiment, the reference current source 300 provides a current of about 2 microamperes (μA). However, it is should be appreciated that other reference current values may be generated in other embodiments.

The trimmable sense amplifier 104 also includes a first current mirror 302. The first current mirror 302 includes a first transistor 304 and a plurality of second transistors 306. The first and second transistors 304, 306 of the illustrated embodiment are implemented with MOSFETs. The first and second transistors 304, 306 each include a gate, a source, and a drain (not numbered). The gate of the first transistor 304 is electrically connected to each gate of each second transistor 306. In the illustrated embodiment, the gate and drain of the first transistor 304 are electrically connected together. Also in the illustrated embodiment, the sources of each transistor 304, 306 are electrically connected together. The reference current source 300 is electrically connected to the drain of the first transistor 304.

A plurality of switches 308 are electrically connected to the plurality of second transistors 306. The plurality of switches 308 operate to connect and disconnect at least one of the second transistors 306 from the circuitry (not numbered) of the trimmable sense amplifier 104. In the illustrated embodiment, one switch 308 is electrically connected to each of the second transistors 306. However, it should be appreciated that one switch 308 could be connected to several second transistors 306 depending on the particular design of the trimmable sense amplifier 104.

In the illustrated embodiment, the trimmable sense amplifier 104 includes a three-to-eight decoder 310. The three-to-eight decoder 310 includes three input lines 311 and eight output lines 312. The three-to-eight decoder 310 receives a three-bit code via the input lines 311 and activates one or more of the output lines 312 based on the three-bit code. Each output line 312 is in communication with one of the switches 308 to activate the switch 308 based on the activation of the corresponding output line 312. More particularly, the three-to-eight decoder 310 of the illustrated embodiment is configured to switch on one, more than one, or all of the switches 308. It should be appreciated that other techniques and devices may be implemented to control the switches 308 besides the three-to-eight decoder 310 described herein.

The trimmable sense amplifier 104 further includes a second current mirror 314. The second current mirror includes a third transistor 316 and a fourth transistor 318. The third and fourth transistors 316, 318 of the illustrated embodiment are implemented with MOSFETs, each including a source, a drain, and a gate (not shown). The third transistor 316 is electrically connected to the plurality of second transistors 306 and the fourth transistor 318 electrically connected to the memory cell 102.

More specifically, in the illustrated embodiment, the drain and the gate of the third transistor 316 are electrically connected together and to the switches 308. The gates of the third and fourth transistors 316, 318 are electrically connected together. The sources of the third and fourth transistors 316, 318 are also electrically connected together. The drain of the fourth transistor 318 is electrically connected to the bit line 208 of the memory cell 102.

The variable current generated by the trimmable sense amplifier 104 of the illustrated embodiment varies between about two μA and nine μA. Specifically, one μA is produced corresponding to each second transistor 306 that is connected with the corresponding switch 308 to the second current mirror 314.

It should be appreciated that in low voltage memory cell 102 operation, a low control gate voltage ($V_{eg}$) of 1.5V±10% at the control gate line 212 may result in a low drain saturation current ($I_{dsat}$) of programmed memory cell 102. As a result, for a constant sense amp current, it might result in detecting a logic '1' (cell erased) instead of Logic '0' (cell programmed). In such a situation, sense amplifier current would need to be reduced. However, reducing the sense amplifier current might result in the wrong detection of an erase cell, like detecting logic '0' instead of logic '1'. This would be worse after numerous, e.g., 100 K, program/erase cycles of the memory cell 102. In such a case, the erase voltage degrades, causing an increase in memory cell 102 current for a fixed control gate voltage $V_{eg}$. This results in wrong detection of an erased memory cell 102. Conversely, increasing the sense amplifier current might cause a wrong detection of a programmed memory cell 102.

As such, a choice of high or low sense amplifier current must be made. This depends largely of process variation in designing and fabricating the semiconductor device 100. By making the sense amplifier current trimmable, i.e., adjustable, the sense amplifier current can be individually optimized on the fabricated semiconductor device 100.

Figure 4:
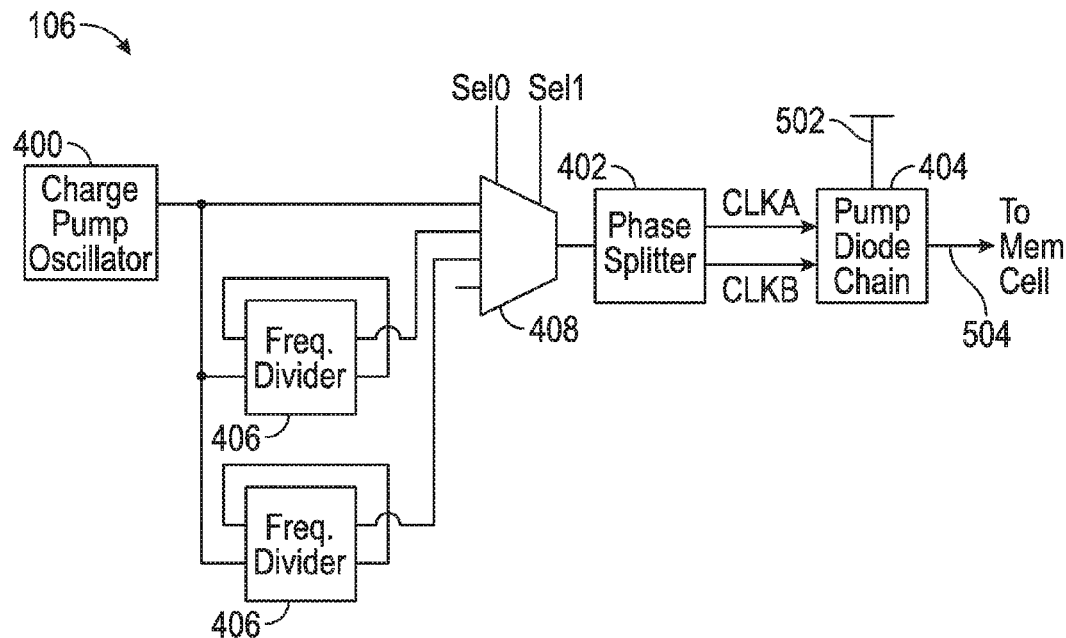
FIG. 4 is an electrical schematic of a charge pump of the semiconductor device in accordance with an exemplary embodiment.

Referring again to FIG. 1, the semiconductor device 100 includes a charge pump 106 electrically connected to the memory cell 102. Referring now to FIG. 4, the charge pump 106 includes a charge pump oscillator 400. The charge pump oscillator 400 is configured to generate an oscillating signal. The charge pump 106 also includes a phase splitter 402 electrically connected to the charge pump oscillator 400. The phase splitter 402 splits the oscillating signal produced by the charge pump oscillator 400 into a first clock signal CLKA and a second clock signal CLKB.

Figure 5:
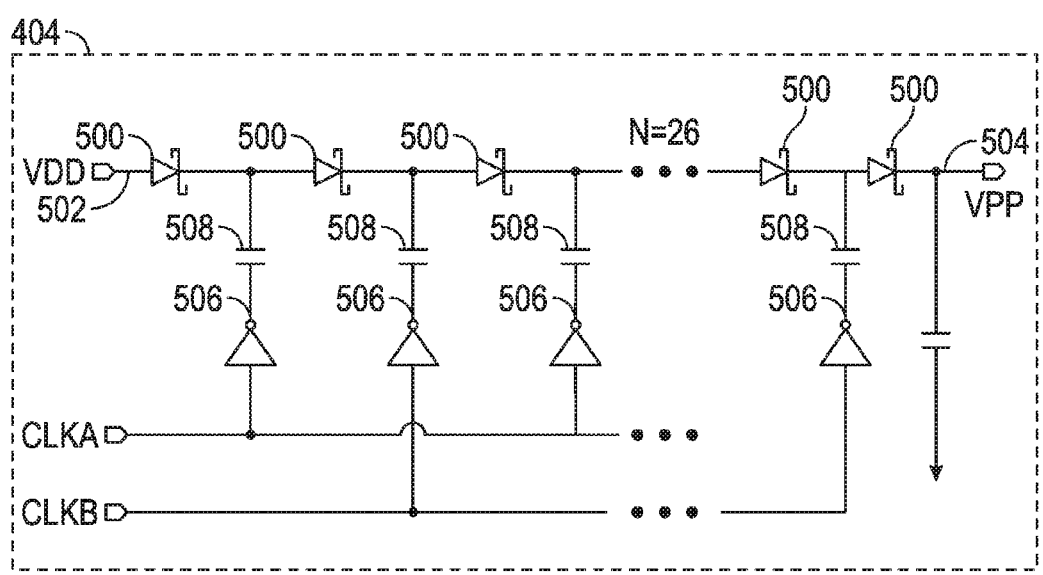
FIG. 5 is an electrical schematic of a diode chain of the charge pump in accordance with an exemplary embodiment.

Referring now to FIGS. 4 and 5, the charge pump 106 includes a diode chain 404 electrically connected to the phase splitter 402. The diode chain, as shown in FIG. 5, includes plurality of diodes 500 electrically connected in series with one another. That is, the cathode (not numbered) of one diode 500 is electrically connected to the anode (not numbered) of another diode 500. In the illustrated embodiment, each diode 500 is a Schottky diode (not separately numbered). A first diode 500 of the diode chain 404 is electrically connected to an input 502 and the last diode 500 is electrically connected to an output 504. The input 502 provides an input voltage and the output 504 supplies an output voltage greater than the input voltage.

In the illustrated embodiment, the input voltage is about 1.5 V. The plurality of diodes 500 of the diode chain 404 includes at least twenty-five diodes 500. More particularly, in the illustrated embodiment, twenty-six diodes 500 are included in the diode chain 404. The output voltage provided by the diode chain 404 of the illustrated embodiment is greater than thirteen times the input voltage. More specifically, in the illustrated embodiment, the output voltage is about 20 V.

The first clock signal CLKA generated by the phase splitter 402 is electrically connected after every other diode 500 and the second clock signal CLKB is electrically connected between the other diodes 500, as is shown schematically in FIG. 5. Specifically, in the illustrated embodiment, a buffer 506 and a capacitor 508 is electrically connected between the clock signals CLKA, CLKB and the diodes 500. As the clock signals CLKA, CLKB alternatively oscillate, the voltage across the diode chain 404 is increased.

Referring again to FIG. 4, the charge pump 106 may include at least one frequency divider 406 electrically coupled between the charge pump oscillator 400 and the phase splitter 402. The frequency divider 406 receives the oscillating signal from the charge pump oscillator 400 and produces a different oscillating signal oscillating at a different frequency.

In the illustrated embodiment, the charge pump 106 includes a pair of frequency dividers 406 electrically coupled between the charge pump oscillator 400 and the phase splitter 402. As such, two different oscillating signals, oscillating at two different frequencies, both different from the original oscillating signal, may be produced. Of course, any number of frequency dividers 406 could be utilized.

The charge pump 106 of the illustrated embodiment also includes a selector 408. The selector 408 includes inputs 410 electrically connected to the charge pump oscillator 400 and the frequency dividers 406. The selector 408 selects one of the oscillating signals such that a single oscillating signal is sent to the phase splitter 402.

By utilizing the frequency dividers 406, the "ramp up" speed of the voltage generated by the diode chain 404 may be controlled. As such, stress on the memory cell 102 is reduced, leading to longer life of the memory cell 102. In the illustrated embodiment, the ramp up speeds of 1.7 volts per microsecond (V/µs), 0.85 V/µs, and 0.43 V/µs may be selected utilizing the selector 408. Of course, in other embodiments, the ramp up speeds may be changed depending on the necessity of the diode chain 404.

Referring again to FIG. 2, the semiconductor device 100 may also include a buffer amplifier 216 electrically connected to the memory cell 102 and the trimmable sense amplifier 104. Data extracted from the memory cell 102 is presented from the buffer amplifier 216.

Referring again to FIG. 1, the semiconductor device 100 may also include a controller 108. The controller 108 includes circuitry for controlling various aspects of the semiconductor device 100. In the illustrated embodiment, the controller 108 is in communication with the trimmable sense amplifier 104 for controlling the current provided to the memory cell 102 via the three-to-eight decoder 310. The controller 108 of the illustrated embodiment is also in communication with the charge pump 106 for controlling the speed at which the voltage produced by the charge pump 106 is increased via the selector 408.

The semiconductor device 100 described above requires only a single power supply to provide the 1.5 V for operation. Thus, it becomes easier and cheaper to integrate the memory cell 102, e.g., an EEPROM, with an integrated circuit, e.g., a system-on-chip.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device, comprising: a memory cell including a plurality of transistors;
a trimmable sense amplifier electrically connected to said memory cell configured to provide variable current to said memory cell, wherein said trimmable sense amplifier comprises:
a reference current source;
a first current mirror including a first transistor and a plurality of second transistors, and
a plurality of switches electrically connected to said plurality of second transistors for connecting and disconnecting at least one of said second transistors.

2. The semiconductor device as set forth in claim 1, wherein the variable current varies between about two microamperes ("µA") and nine µA.

3. The semiconductor device as set forth in claim 1, further comprising a buffer amplifier electrically connected to said memory cell and said trimmable sense amplifier.

4. The semiconductor device as set forth in claim 1, wherein said memory cell comprises an electrically erasable programmable read-only memory ("EEPROM") cell.

5. The semiconductor device as set forth in claim 1 further comprising a controller in communication with said trimmable sense amplifier for controlling the current provided to said memory cell.

6. The semiconductor device as set forth in claim 1, further comprising a second current mirror including a third transistor electrically connected to said plurality of second transistors and a fourth transistor electrically connected to said memory cell.

7. A semiconductor device, comprising:
a memory cell including a plurality of transistors; and
a charge pump electrically connected to said memory cell,
a trimmable sense amplifier electrically connected to said memory cell configured to provide variable current to said memory cell, and
said charge pump including an input for receiving an input voltage and an output for providing an output voltage greater than the input voltage to said memory cell.

8. The semiconductor device as set forth in claim 7, wherein said trimmable sense amplifier comprises:
a reference current source; and
a first current mirror including a first transistor and a plurality of second transistors.

9. The semiconductor device as set forth in claim 8, wherein said trimmable sense amplifier further comprising a plurality of switches electrically connected to said plurality of second transistors for connecting and disconnecting at least one of said second transistors.

10. The semiconductor device as set forth in claim 9, further comprising a second current mirror including a third transistor electrically connected to said plurality of second transistors and a fourth transistor electrically connected to said memory cell.

11. The semiconductor device as set forth in claim 7, wherein said charge pump includes a plurality of diodes disposed in series with one another.

12. The semiconductor device as set forth in claim 11, wherein each diode is a Schottky diode.

13. The semiconductor device as set forth in claim 11, wherein said plurality of diodes comprises at least twenty-five diodes.

14. The semiconductor device as set forth in claim 7, wherein said charge pump provides an output voltage greater than 13 times the input voltage.

15. The semiconductor device as set forth in claim 14, wherein said charge pump provides an output voltage of about 20 V from the input voltage of about 1.5 V.

16. The semiconductor device as set forth in claim 7, wherein said charge pump comprises a charge pump oscillator configured to generate an oscillating signal.

17. The semiconductor device as set forth in claim 16, wherein said charge pump comprises a phase splitter electrically coupled to said charge pump oscillator and said plurality of diodes and configured to receive the oscillating signal and split the oscillating signal into a first clock signal and a second clock signal.

18. The semiconductor device as set forth in claim 17, wherein said charge pump comprises at least one frequency divider electrically coupled between said charge pump oscillator and said phase splitter.

19. The semiconductor device as set forth in claim 7, wherein said memory cell comprises an electrically erasable programmable read-only memory ("EEPROM") cell.

20. A method of operating a semiconductor device, the semiconductor device including a memory cell, said method comprising:
providing a variable current to the memory cell from a trimmable sense amplifier;
receiving an input voltage at an input of a charge pump;
generating an output voltage greater than the input voltage with the charge pump; and providing the output voltage from the charge pump to the memory cell.

\* \* \* \* \*